(12) United States Patent
McTeer

(10) Patent No.: US 6,339,026 B1
(45) Date of Patent: *Jan. 15, 2002

(54) SEMICONDUCTOR PROCESSING METHODS OF POLISHING ALUMINUM-COMPRISING LAYERS

(75) Inventor: Allen McTeer, Meridian, ID (US)

(73) Assignee: Micron Technology, Inc., Boise, IA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,614

(22) Filed: Apr. 24, 1998

(51) Int. Cl.$^7$ ............................................. H01L 21/44
(52) U.S. Cl. .................... 438/688; 438/658; 438/959
(58) Field of Search ........................... 438/658, 688, 438/768, 959

(56) References Cited

U.S. PATENT DOCUMENTS

| | | | |
|---|---|---|---|
| 4,235,648 A | 11/1980 | Richardson | 148/6.27 |
| 5,019,891 A | 5/1991 | Onuki et al. | 357/70 |
| 5,288,665 A | 2/1994 | Nulman | 437/194 |
| 5,434,104 A | 7/1995 | Cain | 437/198 |
| 5,945,739 A | 8/1999 | Yajima | |

FOREIGN PATENT DOCUMENTS

| | | |
|---|---|---|
| JP | 2-159064 | 12/1988 |
| JP | 2-91970 | 3/1990 |
| JP | 2-229433 | 9/1990 |
| JP | 6-120220 | 4/1994 |

OTHER PUBLICATIONS

"Ultraclean Surface Processing of Silicon Wafers," edited by Takeshi Hattori, Springer Pub., p.421–4, 1995.
"Silicon Processing for the VLSI Era, vol. 2: Process Integration," S. Wolf, Lattice Press, p.260, 1990.

Primary Examiner—Charles Bowers
Assistant Examiner—Nema Berezny
(74) Attorney, Agent, or Firm—Wells, St. John, Roberts, Gregory, & Matkin, P.S.

(57) ABSTRACT

In one aspect the invention includes a method of protecting aluminum within an aluminum-comprising layer from electrochemical degradation during semiconductor processing comprising, providing a material within the layer having a lower reduction potential than aluminum. In another aspect, the invention includes a semiconductor processing method of forming and processing an aluminum-comprising mass, comprising: a) forming the aluminum-comprising layer mass to comprise a material having a lower reduction potential than aluminum; and b) exposing the aluminum-comprising mass to an electrolytic substance, the material protecting aluminum within the aluminum-comprising layer from electrochemical degradation during the exposing. In yet another aspect, the invention includes an aluminum-comprising layer over or within a semiconductor wafer substrate and comprising a material having a lower reduction potential than aluminum.

32 Claims, 1 Drawing Sheet

SEMICONDUCTOR PROCESSING METHODS OF POLISHING ALUMINUM-COMPRISING LAYERS

TECHNICAL FIELD

The invention pertains to aluminum-comprising layers extending over or within semiconductor wafer substrates, and pertains to methods of forming and polishing aluminum-comprising masses. Further, the invention pertains to methods of protecting aluminum within aluminum-comprising layers from electrochemical degradation during semiconductor processing.

BACKGROUND OF THE INVENTION

Aluminum-comprising materials are frequently utilized in integrated circuitry formed on semiconductive wafers. The aluminum-comprising materials can consist essentially of elemental aluminum, or can comprise an alloy, such as aluminum/copper. Such aluminum-comprising materials are utilized as, for example, circuit components or conductive interconnects for electrically connecting circuit components.

A method of forming aluminum-comprising conductive interconnects is a damascene method. In a damascene method, a pattern of trenches is formed within an insulative material. An aluminum-comprising layer is then formed over the insulating material and within the trenches. The aluminum-comprising material is then planarized to remove portions of the material that are not within trenches.

The planarization typically comprises chemical-mechanical polishing utilizing a polishing pad to rub an abrasive slurry against the aluminum-comprising layer. Typically, the slurry comprises an aluminum oxide grit within an aqueous carrier solution. The slurry can have a pH of, for example, from about 2.5 to about 4.0. Example slurries are EP-A5655 (sold by Cabot), and XVS-6902 (sold by Rodel).

After desired abrasion of the aluminum-comprising layer, deionized water is flushed between the polishing pad and the layer to displace the polishing slurry from a surface of the aluminum-comprising layer. Typically, the polishing pad continues to spin relative to the surface as the water is provided between the pad and the surface. However, as the water does not comprise a grit, the abrasion of the aluminum-comprising layer is substantially reduced as the water displaces the slurry.

After the slurry is displaced, the polishing pad is separated from the aluminum-comprising layer, and the layer is rinsed with additional deionized water to further clean the polished surface. The rinsing can comprise spraying the layer with water, and/or submerging a wafer comprising the aluminum-comprising layer in a water bath. The water utilized for displacing the slurry, and for the rinse after displacing the slurry, typically has a pH of at least 7.0.

After the aluminum-comprising layer is rinsed with water, it is dried to remove the water before subsequent processing.

A difficulty which can occur during the above-described processing sequence is corrosion of a polished aluminum-comprising material. The corrosion can result in a loss of some or all of the aluminum-comprising material that is intended to remain on the wafer after the polishing process. If a relatively small amount of the material is lost, pits can occur within the aluminum-comprising material. If a larger amount of the material is lost, large crevices can be formed within the material.

Corrosion of an aluminum-comprising material can adversely affect physical properties of conductive lines formed from the aluminum-comprising material. For instance, conductance and strength of the aluminum-comprising material can be adversely affected. Also, pitting or crevice formation can decrease a surface planarity of a polished aluminum-comprising layer. As high surface planarity is frequently desirable for subsequent process steps, a decrease in surface planarity can adversely affect downstream fabrication processes utilizing the corroded aluminum-comprising layer. It would be desirable to develop alternative methods of processing aluminum-comprising layers wherein the above-described corrosion is avoided or at least reduced.

SUMMARY OF THE INVENTION

In one aspect, the invention encompasses a method of protecting aluminum within an aluminum-comprising layer from electrochemical degradation during semiconductor processing. A material that has a lower reduction potential than aluminum is provided within the layer.

In another aspect, the invention encompasses a semiconductor processing method of forming an aluminum-comprising line within an electrically insulative layer. An electrically insulative layer is formed over a semiconductive substrate. Trenches are formed within the electrically insulative layer. An aluminum-comprising layer is formed within the trenches and over the electrically insulative layer. The aluminum-comprising layer comprises a material that has a lower reduction potential than aluminum. The aluminum-comprising layer is planarized to form aluminum-comprising lines within the electrically insulative material.

In yet another aspect, the invention includes an aluminum-comprising layer over or within a semiconductor wafer substrate and comprising a material having a lower reduction potential than aluminum.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Pat. Laws "to promote the progress of science and useful arts" (Article 1, Section 8).

Figure 1:
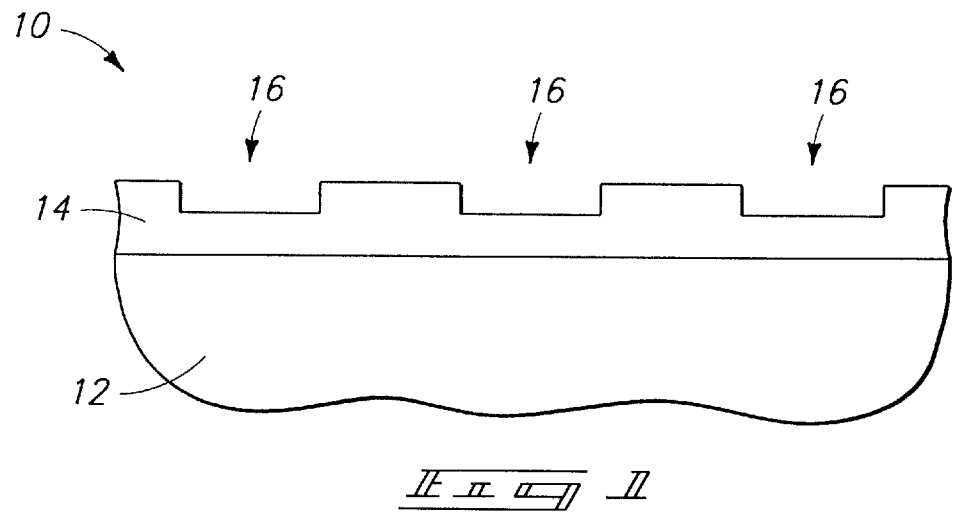
FIG. 1 is a fragmentary, diagrammatic, cross-sectional view of a semiconductor wafer fragment at a preliminary processing step of a method of the present invention.

An exemplary embodiment of the present invention is described with reference to FIGS. 1–3. Referring to FIG. 1, a semiconductor wafer fragment 10 comprises a substrate 12 and a dielectric (i.e. electrically insulative) layer 14 formed over substrate 12. Substrate 12 can comprise, for example, a monocrystalline silicon wafer lightly doped with a p-type conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Dielectric layer 14 can comprise, for example, silicon dioxide or borophosphosilicate glass (BPSG). Trenches 16 are formed within dielectric layer 14, and define locations for one or more aluminum-comprising lines.

Figure 2:
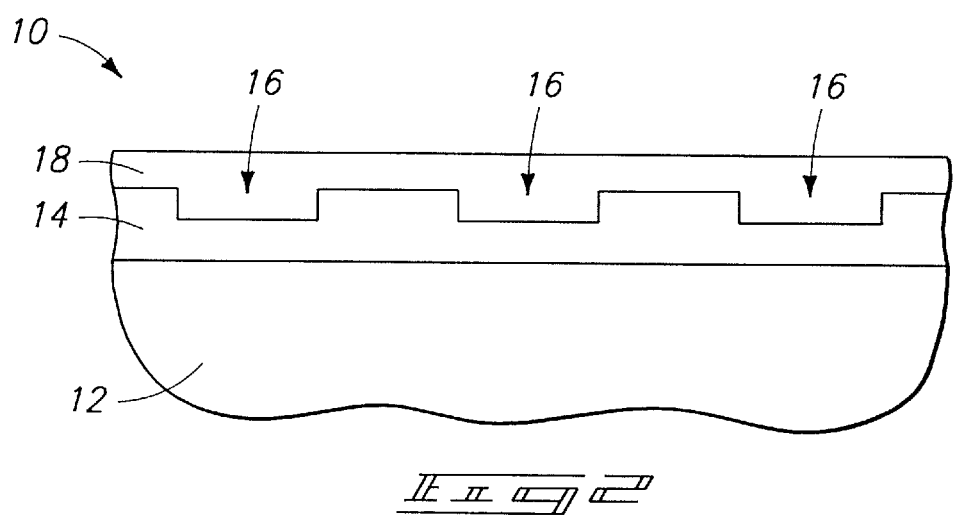
FIG. 2 is a view of the FIG. 1 wafer fragment shown at a processing step subsequent to that of FIG. 1.

Referring to FIG. 2, an aluminum-comprising layer 18 is formed over substrate 12 and within trenches 16. The aluminum within aluminum-comprising layer 18 can be in the form of, for example, elemental aluminum, or an aluminum-copper alloy. If aluminum-comprising layer 18 comprises an aluminum-copper alloy, the copper can be present, for example, in a concentration of from about 0.25 to about 2.5 weight percent.

Aluminum-comprising layer 18 further comprises a material having a lower reduction potential than aluminum. Such materials can comprise, for example, alkali metals (Group 1A of the Periodic Table) or alkaline earth metals (Group 2A of the Periodic Table). For instance, the material can comprise magnesium and/or lithium, or can consist essentially of magnesium or lithium. The material having a lower reduction potential than aluminum is preferably provided within aluminum-comprising layer 18 to a concentration of from about 0.25 weight percent to about 5.0 weight percent, but is preferably not provided to a concentration which exceeds its solubility in the aluminum or aluminum alloy of the aluminum-comprising layer. The aluminum-comprising layer 18 can be formed, for example, by sputter deposition utilizing a target that comprises aluminum and the material having a lower reduction potential than aluminum.

It is observed that the prior art corrosion of aluminum-comprising layers is due at least in part to electrochemical degradation of the layers. Such electrochemical degradation can occur when the aluminum-comprising layer contacts an electrolytic substance. An example electrolytic substance is a water-comprising liquid. An aluminum-comprising layer can contact a water comprising liquid, for example, after a polishing process when water is added to displace a polishing slurry from a polished aluminum-comprising layer. Methods of the present invention can reduce or eliminate electrochemical degradation of aluminum by providing the material having a lower reduction potential than aluminum within an aluminum-comprising layer. Specifically, if electrochemical degradation within the aluminum-comprising layer occurs, the material having a lower reduction potential than aluminum becomes a sacrificial anode which selectively corrodes before the aluminum. The material thus provides cathodic protection of the aluminum within the aluminum-comprising layer. More specifically, the material selectively oxidizes before the aluminum and thus causes the aluminum to be a cathode in an electrolytic reaction, rather than an anode.

It is found that defects formed in an aluminum-comprising layer of the present invention (i.e, defects occurring as a material having a lower reduction potential than aluminum is electrochemically degraded) are generally smaller and less detrimental to physical properties of the aluminum-comprising layer then were the pits formed by corrosion occurring during prior art processing methods (i.e., the pits formed by electrochemical degradation of aluminum). Accordingly, an aluminum-comprising layer of the present invention can retain better conductance and other physical properties than prior art aluminum-comprising layers after exposure to an electrolytic substance.

Figure 3:
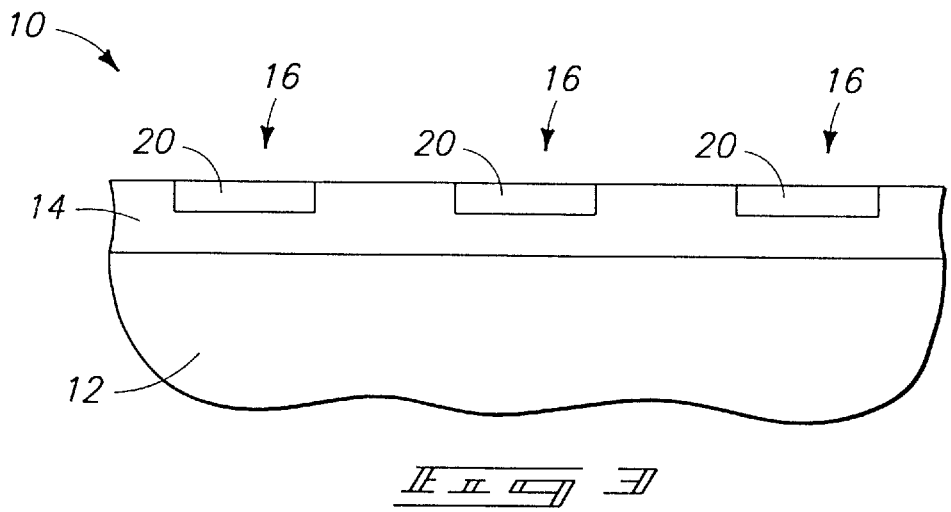
FIG. 3 is a view of the FIG. 1 wafer fragment shown at a processing step subsequent to that of FIG. 2.

Referring to FIG. 3, aluminum-comprising layer 18 (FIG. 2) is planarized to form one or more aluminum-comprising lines 16 extending within insulative material 14. The planarization can comprise, for example, chemical-mechanical polishing. An example chemical-mechanical polishing process utilizes a polishing pad and an abrasive polishing slurry to grind away a portion of aluminum-comprising layer 18 (FIG. 2) that is over insulative material 14. After such portion of aluminum-comprising layer 18 is removed, the polishing slurry is displaced with deionized water. The deionized water can, for example, have a pH of at least about 7.0. After the slurry is displaced from over aluminum-comprising lines 16, a wafer comprising the lines can be rinsed with water to further clean one or more surfaces of the wafer. The inclusion of a material having a lower reduction potential than aluminum within aluminum-comprising layer 18 can protect the aluminum within aluminum-comprising layer 18 from electrochemical degradation during the displacement of the slurry and the rinsing of the wafer.

It is to be understood that a process of the present invention can alleviate electrochemical degradation of aluminum at a wide array of pHs. For instance, a process of the present invention can alleviate electrochemical degradation occurring during exposure of aluminum to fluids having pHs of at least 7, or during exposure of aluminum to fluids having pHs below 7. As electrochemical degradation can be particularly problematic at pHs above 7 or below 3, a method of the present invention can be particularly useful at such pHs.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of polishing an aluminum-comprising layer, comprising:
    forming the aluminum-comprising layer to comprise at least one of Rb, Sr, Fr, and Ra exposing the aluminum-comprising layer to a polishing slurry and a polishing pad to polish the aluminum-comprising layer; and
    exposing the aluminum-comprising layer to an electrolytic substance.

2. The method of claim 1 wherein the layer comprises Rb.

3. The method of claim 1 wherein the layer comprises Sr.

4. The method of claim 1 further comprising displacing the polishing slurry from the aluminum-comprising layer with a water-comprising liquid provided between the polishing pad and the layer, the exposing occurring during the displacing and the water-comprising liquid being the electrolytic substance.

5. The method of claim 4 wherein the water-comprising liquid consists essentially of water.

6. The method of claim 4 wherein the water-comprising liquid has a pH of greater than 7.0.

7. The method of claim 4 wherein the exposing occurs as the aluminum-comprising layer is rinsed with a water-comprising liquid after the polishing, the water-comprising liquid being the electrolytic substance.

8. The method of claim 7 wherein the water-comprising liquid consists essentially of water.

9. The method of claim 7 wherein the water-comprising liquid has a pH of at least 7.0.

10. The method of claim 7 wherein the water-comprising liquid has a pH of less than 7.0.

11. The method of claim 7 wherein the water-comprising liquid has a pH of less than 3.0.

12. A semiconductor processing method of forming an aluminum-comprising line within an electrically insulative layer, comprising:

forming an electrically insulative layer over a semiconductive substrate;

forming trenches within the electrically insulative layer;

forming an aluminum-comprising layer within the trenches and over the electrically insulative layer, the aluminum-comprising layer comprising at least one of Rb, Sr, Fr, and Ra; and planarizing the aluminum-comprising layer to form aluminum-comprising lines within the electrically insulative material.

13. The method of claim 12 wherein the forming the aluminum-comprising layer comprises sputter deposition.

14. The method of claim 1, wherein the layer comprises Ra.

15. The method of claim 12, wherein the layer comprises Rb.

16. The method of claim 12, wherein the layer comprises Sr.

17. The method of claim 12, wherein the layer comprises Ra.

18. The method of claim 12, wherein the planarizing comprises a chemical-mechanical polishing process.

19. A semiconductor processing method of forming and processing an aluminum-comprising layer, comprising;

forming the aluminum-comprising layer to comprise at least one of Rb, Sr, Fr, and Ra; and exposing the aluminum-comprising layer to an electrolytic substance.

20. The method of claim 19, wherein the electrolytic substance is a liquid.

21. The method of claim 19, wherein the layer comprises Rb.

22. The method of claim 19, wherein the layer comprises Sr.

23. The method of claim 19, wherein the layer comprises Ra.

24. The method of claim 19, wherein the electrolytic substance comprises water.

25. A method of protecting aluminum within an aluminum-comprising layer from electrochemical degradation during semiconductor processing comprising, providing a material within the layer comprising at least one of Rb, Sr, Fr, and Ra.

26. The method of claim 25, wherein the material comprises Rb.

27. The method of claim 25, wherein the material comprises Sr.

28. The method of claim 25, wherein the material comprises Ra.

29. The method of claim 25, wherein the aluminum is in the form of elemental aluminum.

30. The method of claim 25, wherein the aluminum is in the form of an aluminum-copper alloy.

31. The method of claim 25, wherein the aluminum-comprising layer comprises an aluminum-copper alloy, the alloy comprising from about 0.25 weight percent to about 2.5 weight percent copper.

32. The method of claim 28, wherein the material is provided to a concentration of from about 0.25 weight percent to about 5.0 weight percent in the aluminum-comprising layer.

* * * * *

UNITED STATES PATENT AND TRADEMARK OFFICE
CERTIFICATE OF CORRECTION

| | | |
|---|---|---|
| PATENT NO. | : 6,339,026 B1 | Page 1 of 1 |
| DATED | : January 15, 2002 | |
| INVENTOR(S) | : Allen McTeer | |

It is certified that error appears in the above-identified patent and that said Letters Patent is hereby corrected as shown below:

Column 4,
Line 60, replace "claim 4" with -- claim 1 --.

Column 6,
Line 30, replace "claim 28" with -- claim 25 --.

Signed and Sealed this

Twenty-seventh Day of August, 2002

Attest:

Attesting Officer

JAMES E. ROGAN
*Director of the United States Patent and Trademark Office*